United States Patent
Pillet et al.

(10) Patent No.: US 6,853,073 B2
(45) Date of Patent: Feb. 8, 2005

(54) MICROWAVE ELECTRONIC DEVICES COMPRISING A METAL ENCLOSURE

(75) Inventors: Didier Pillet, Savigny sur Orge (FR); Benjamin Thon, Janailhac (FR); Dominique Baillargeat, Limoges (FR); Serge Verdeyme, Aix-sur-Vienne (FR)

(73) Assignee: Avanex Corporation, Fremont, CA (US)

( * ) Notice: Subject to any disclaimer, the term of this patent is extended or adjusted under 35 U.S.C. 154(b) by 64 days.

(21) Appl. No.: 10/442,966

(22) Filed: May 22, 2003

(65) Prior Publication Data

US 2003/0218242 A1 Nov. 27, 2003

(30) Foreign Application Priority Data

May 23, 2002 (FR) ............................................. 02 06285

(51) Int. Cl.[7] ............................................... H01L 23/34
(52) U.S. Cl. ........................ 257/728; 257/665; 257/692; 257/104; 257/780; 333/247
(58) Field of Search ................................. 257/665, 692, 257/704, 728, 780; 333/247, 254

(56) References Cited

U.S. PATENT DOCUMENTS

| | | | |
|---|---|---|---|
| 3,936,778 A | 2/1976 | De Ronde | |
| 4,270,106 A | 5/1981 | Woermbke | |
| 5,065,123 A | 11/1991 | Hechaman et al. | |
| 5,698,898 A | * 12/1997 | Matsumoto | ................... 257/712 |
| 6,545,573 B1 | * 4/2003 | Dautartas et al. | ............ 333/247 |
| 2003/0080836 A1 | * 5/2003 | Nagaishi et al. | ............. 333/247 |
| 2004/0036559 A1 | * 2/2004 | Sue et al. | .................... 333/247 |

FOREIGN PATENT DOCUMENTS

| | | |
|---|---|---|
| EP | 0 498 893 A1 | 8/1992 |
| EP | 1 137 094 A2 | 9/2001 |
| JP | 63-300597 A | 12/1988 |
| JP | 01173901 A | * 7/1989 ............. H01P/1/00 |

OTHER PUBLICATIONS

Yook J–G et al: "Experimental and Theoretical Study of Parasitic leakage/Resonance in a K/KA–Band MMIC Package" IEEE Transactions on Microwave Theory and Techniques, IEEE Inc. New York, US, vol. 44, No. 12, Part 2, Dec. 1, 1996, pp. 2403–2409, XP000636422.

* cited by examiner

*Primary Examiner*—Tom Thomas
*Assistant Examiner*—Mathew E. Warren
(74) *Attorney, Agent, or Firm*—Moser, Patterson & Sheridan, L.L.

(57) ABSTRACT

The present invention relates to a microwave electronic device (1) comprising a metal enclosure (2) having a bottom (21) and a lid (23) and containing an electronic circuit board (3) disposed substantially parallel to said bottom and to said lid, said circuit board having:
- conductive bottom and top grounding layers (41, 42) respectively disposed on bottom and top faces (31, 32) of the circuit board, and
- perforations (7a) transverse to said faces of the circuit board and delimited by conductive walls (71) for electrically interconnecting said layers (41, 42).

At least some of said walls (71) are electrically connected to the lid of the enclosure by conductive grounding members (8a). Each conductive member (8a) has a metal blade covered with a material (13, 13') for absorbing microwaves.

9 Claims, 3 Drawing Sheets

FIG_1
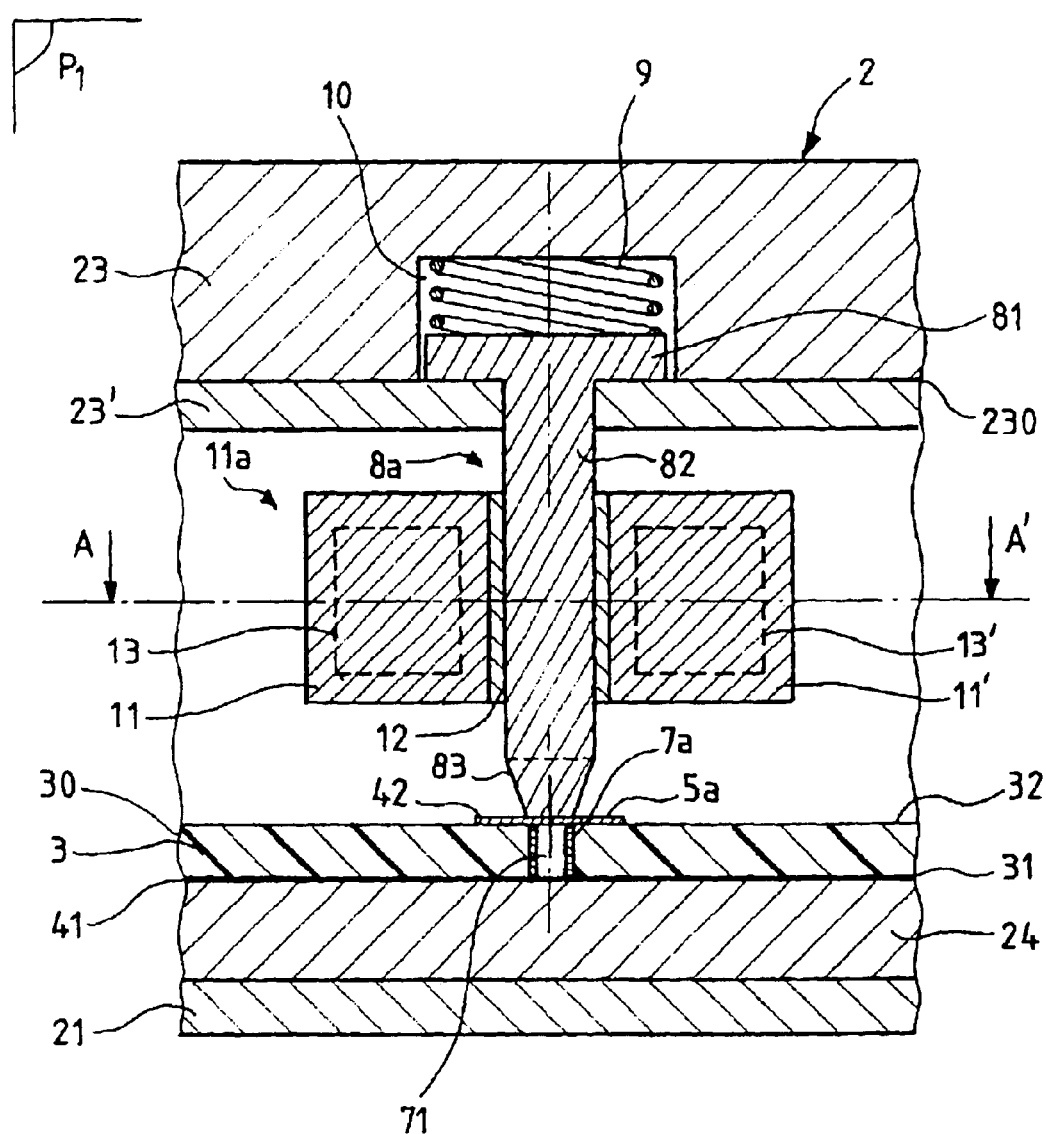

FIG_2
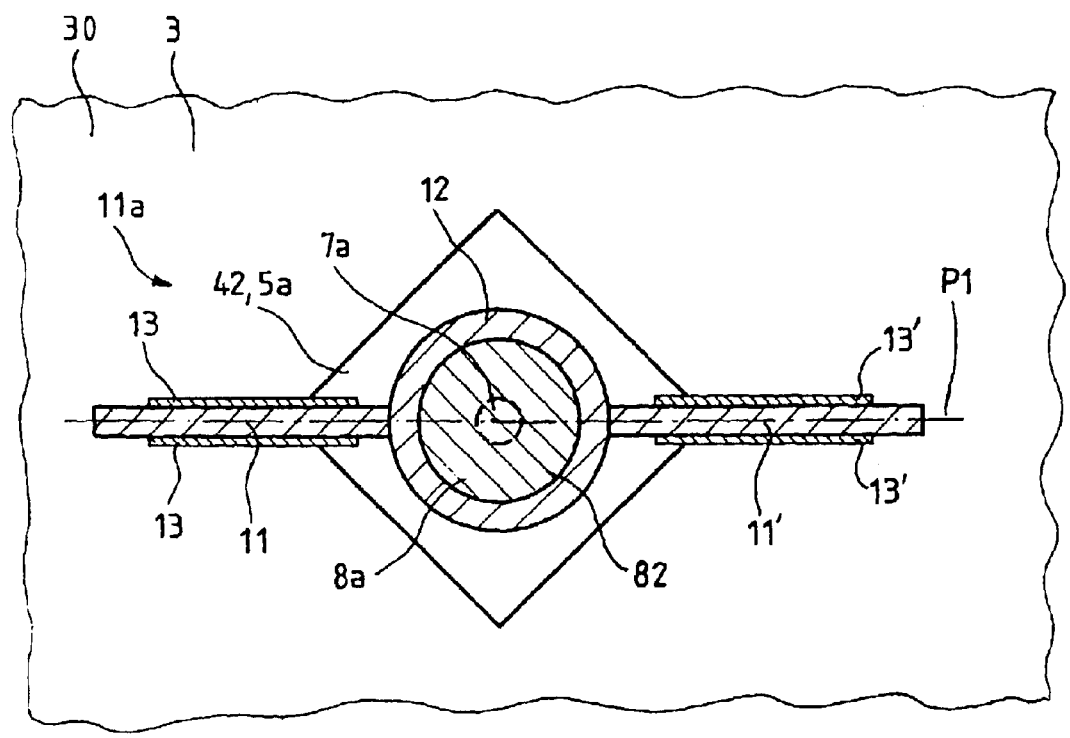

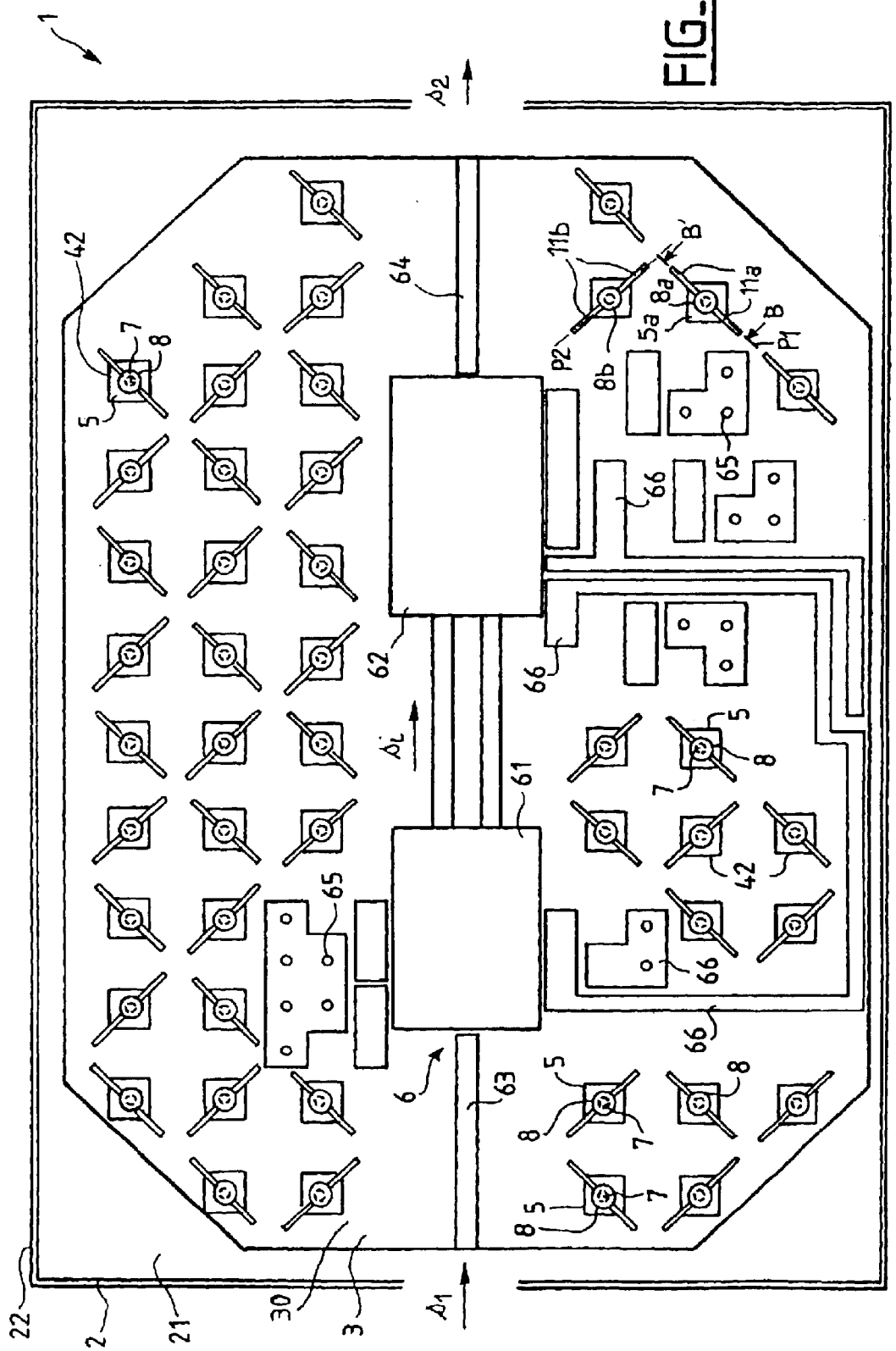
FIG_3

MICROWAVE ELECTRONIC DEVICES COMPRISING A METAL ENCLOSURE

The field of the present invention is that of electronic devices for use in opto-electronic modules and in particular microwave electronic devices comprising a metal enclosure with a bottom and a lid and an electronic circuit board disposed substantially parallel to said bottom and said lid.

The opto-electronic modules used in optical telecommunications incorporate microwave electronic devices including an enclosure. This is known in the art. The enclosure is the seat of transverse magnetic or transverse electric electromagnetic waves generated in cavities formed inside the enclosure and characterized by their length, their width, and their height. The wavelengths of such waves, which are commonly referred to as cavity modes, depend on the dimensions of the cavities.

There are two types of cavity. Cavities of a first type are formed within the substrate of the electronic circuit board on which active and passive electronic components are placed. The circuit board is typically parallel to the metal bottom of the enclosure and is generally raised by means of a metal baseplate. Cavities of a second type are associated with an "air" region situated between the circuit board and the metal lid of the enclosure.

If a microwave signal modulated at 40 gigahertz (GHz), for example, is injected into the device, some of these electromagnetic modes are excited and cause unwanted "air resonances" or "substrate resonances" that limit the performance of the device. For example, if the device is a microwave signal amplifier module, its gain curve is affected by fluctuations across the whole of the modulation frequency range known as the working band.

One prior art solution for attenuating unwanted substrate resonances consists in forming via-holes in the circuit board to interconnect conductive ground layers on the faces of the circuit board and connected to the bottom of the enclosure. That solution is used in the ALCATEL A1915LMM opto-electronic module.

However, there is no solution for significantly reducing the number of unwanted air resonances. That phenomenon is particularly critical in wideband applications and/or for high-power microwave signals.

The object of the invention is to provide an enclosure for microwave electronic devices in which the number and intensity of unwanted substrate and air resonances are reduced, at least in the working band.

To this end, the present invention proposes a microwave electronic device comprising a metal enclosure having a bottom and a lid and containing an electronic circuit board disposed substantially parallel to said bottom and to said lid, said circuit board having:

conductive bottom and top grounding layers respectively disposed on bottom and top faces of the circuit board, and perforation transverse to said faces of the circuit board and delimited by conductive walls for electrically interconnecting said bottom and top grounding layers, at least some of said walls being electrically connected to the lid of the enclosure by conductive grounding members, which device is characterized in that each conductive member has a metal blade disposed between said lid and said top layer in a blade plane perpendicular to said faces and covered at least in part with a material for absorbing microwaves at frequencies less than or equal to a maximum operating frequency of said device.

In accordance with the invention, the grounding members are provided with blades covered with absorbent material and contribute to the electrical continuity between the bottom of the enclosure, which is connected to the bottom grounding layer, and the lid. These members short circuit electric fields associated with the transverse and longitudinal electromagnetic resonance modes. By reducing in particular the dimensions of the air cavities, the wavelengths of the air resonances are shifted so that they correspond to frequencies higher than those of the working band. Furthermore, residual lower frequencies are absorbed by the absorbent blades.

This grounding and absorption prevent voltage fluctuations caused by unwanted electromagnetic resonance phenomena: a wanted signal injected into the device therefore suffers little distortion at its output, which limits the generation of errors that degrade transmission quality.

The absorption can advantageously be increased in various ways. Thus each conductive member can have two metal blades disposed in the same blade plane. Alternatively, the respective blade planes of two adjacent needles can be substantially perpendicular.

In a preferred embodiment, the grounding members are disposed so that the distance between the centers of two adjacent members is less than the associated half-wavelength at said maximum frequency.

The term "adjacent" refers to grounding members that are not separated by electronic components of the circuit on the circuit board. The effective wavelength is calculated allowing for the propagation of waves in air and in the dielectric substrate of the circuit board alongside microwave lines on the circuit board.

Furthermore, in the invention, the top grounding layer is preferably formed of a plurality of substantially square metal members each having one of said perforations at its center and receiving an associated grounding member.

In one advantageous embodiment, each grounding member has a portion in the form of a metal needle perpendicular to said faces and having a cylindrical top part and a frustoconical bottom part extended by said associated perforation and in contact with said top grounding layer.

An array of metal needles of the invention is simple to fabricate.

Each needle is preferably centered on a respective square member and said top part has a diameter between the diameter of the associated perforation and the side length of the associated square.

In the invention, the lid may have cavities in its bottom face each of which is coupled to a grounding member via a metal spring disposed transversely to said bottom face of the lid.

The invention naturally also provides an opto-electronic module including the above-defined microwave electronic device.

Features and objects of the present invention emerge from the detailed description given below by way of illustrative and non-limiting example and with reference to the accompanying drawings.

In the drawings:

FIG. 1 is a fragmentary view in cross-section taken on line B–B' in FIG. 3, showing a preferred embodiment of a microwave electronic device of the invention comprising an enclosure containing an electronic circuit board;

FIG. 2 is a fragmentary view to a larger scale and in section taken on line A–A' in FIG. 1, showing the device shown in that figure; and FIG. 3 is a diagrammatic top view of the FIG. 1 microwave electronic device, showing the enclosure without its lid.

FIG. 1 is a fragmentary view in cross-section taken on line B–B' in FIG. 3, showing a microwave electronic device of the invention comprising an enclosure 2 having a bottom 21 and a lid 23 and containing a rectangular electronic circuit board 3 having a dielectric alumina substrate 30 disposed substantially parallel to said bottom 21 and to said lid 23. For clarity, the transverse walls of the enclosure 2 are not shown in FIG. 1.

The electronic circuit board 3 shown in FIG. 1 rests on a metal baseplate 24 for evacuating heat and has:

a bottom face 31 connected to the bottom 21 of the enclosure and entirely covered with a bottom grounding layer 41, for example a layer of gold, a few microns ($\mu$m) thick, and a top face 32 on the same side as the lid 23 and including a substantially square metal (for example gold) member 5a with a side length of approximately 0.5 millimeters (mm) and a thickness of a few microns, the metal square 5a being part of a top grounding layer 42 covering part of the face 32.

A perforation 7a in the circuit board 3 extending transversely to the faces 31, 32, and known as a via-hole, is delimited by transverse gold walls 71, has a diameter of the order of 0.4 mm, and electrically interconnects the bottom and top grounding layers 41, 42.

The via-hole 7a is centered on the metal square 5a, as is a metal (for example stainless steel) needle 8a extending from the top grounding face 42 as far as the lid 23.

The metal needle 8a has a cylindrical head 81, a cylindrical top part 82, and a frustoconical bottom part 83 resting on the metal square 5a.

The height of the needle 8a is of the order of 3 mm. To compensate any variation in the lengths of the needles, the head 81 is fastened to a metal spring 9 disposed in a cavity 10 on the bottom face 230 of the lid 23. The edges of the head 81 rest on a metal plate 23' fastened to the bottom face 230 and perforated to provide a passage for the cylindrical top part 82.

The diameter of the cylindrical top part 82 is from 0.4 mm to 0.5 mm.

Two rectangular metal blades 11, 11' constituting a blade group 11a are mounted on respective opposite sides of the cylindrical top part 82 by means of a metal sheath 12 and define a blade plane P1 transverse to the faces 41, 42 of the circuit board 3. Also, as indicated by a dashed outline, the blades 11, 11' are partly covered with a material 13, 13', such as absorbent carbon foam, for reducing the microwave energy level associated with unwanted resonant modes in the working band.

FIG. 2 is a view of part of the device in section taken along the line A–A' in FIG. 1 parallel to the circuit board 3, and defines more clearly the geometrical relationships between, on the one hand, the members 11 to 13' of the needle 8a and, on the other hand, between the needle 8a and the via-hole 7a (shown in dashed outline) and the metal square 5a, respectively.

FIG. 3 is a diagrammatic top view of the microwave electronic device 1 shown in part in FIG. 1, the enclosure 2 comprising the bottom 21 and transverse walls 22 and being shown without the lid, for greater clarity. The section line B–B' for FIG. 1 is also shown in this figure.

The electronic device 1 is designed to control an electro-absorption or lithium niobate electro-optical modulator (not shown, situated on the right-hand side of the device in FIG. 3). The device is an amplifier for wideband modulated microwave signals at frequencies up to 40 GHz, for example, which are referred to as wanted signals $s_1$ and which are produced by an electrical multiplexer, for example (not shown, situated on the left-hand side of the device 1 in FIG. 3).

The wanted input signals $s_1$ have a low power level, typically a peak-to-peak voltage of the order of 0.4 V. The output signals $s_2$ have a peak-to-peak voltage from 4 V to 6 V, approximately. The output signals $s_2$ are injected into the electro-optical modulator for transferring the modulation, and therefore the data constituting the information, to optical signals to be transmitted by optical means.

The top grounding layer 42 is formed of a plurality of metal squares 5 similar to the square 5a (see FIG. 1). These members 5 are distributed over the electronic circuit board 3 on either side of a circuit 6 containing active components consisting of an electrical pre-amplifier 61 and an electrical amplifier 62 respectively disposed between input waveguide lines 63 and the output waveguide lines 64 for the wanted input signals $s_1$ and the wanted output signals $s_2$, respectively.

Metallization planes 65 are produced conventionally in the vicinity of the active components 61, 62, including some with contacts 66 for the power supply to the amplifiers, and passive components (resistors and capacitors, not shown). In this way a direct current (DC) bias voltage is delivered to the amplifiers and propagation into the device of leaking wanted signals $s_1$ is limited.

Furthermore, each metal square 5 has a via-hole 7 at its center (as indicated by a dashed outline) and supports a centered needle 8. The holes 7 and the needles 8 are similar to the via-hole 7a and the needle 8a shown in detail in FIGS. 1 and 2.

The distribution of the needles 8 is such that the distance between the centers of two adjacent needles, for example the needles 8a and 8b, is approximately 1 mm. This distance is less than the effective half-wavelength at 40 GHz (typically of the order of 1.5 mm).

Thus operation below 40 GHz is optimized by reducing the number and intensity of unwanted substrate and air cavity modes in the working band by means of the needles 8 coupled to the via-holes 7 and to the lid. As a result, the wanted output signals $s_2$ are not distorted and the required power level is achieved.

The blade planes P1, P2 defined by the respective groups 11a, 11b of blades carried by the two adjacent needles 8a, 8b are substantially perpendicular in order to increase the size of the blades and the quantity of absorbent material deposited.

The electronic device 1 can be part of an electro-optical module.

Of course, the foregoing description has been given by way of purely illustrative example. Any means can be replaced by equivalent means without departing from the scope of the invention.

The grounding members of the invention can also be planar, tubular, or in the form of filaments.

What is claimed is:

1. A microwave electronic device (1) comprising a metal enclosure (2) having a bottom (21) and a lid (23) and containing an electronic circuit board (3) disposed substantially parallel to said bottom and to said lid, said circuit board having:

conductive bottom and top grounding layers (41,42) respectively disposed on bottom and top faces (31, 32) of the circuit board, and perforations (7, 7a) transverse to said faces of the circuit board and delimited by conductive walls (71) for electrically interconnecting said bottom and top grounding layers (41, 42), at least some of said walls (71) being electrically connected to the lid of the enclosure by conductive grounding members (8, 8a, 8b), which device is characterized in that each conductive member (8a) has a metal blade (11, 11') disposed between said lid and said top layer in a blade plane (P1) perpendicular to said faces (31, 32) and covered at least in part with a material (13, 13') for absorbing microwaves at frequencies less than or equal to a maximum operating frequency of said device.

2. A microwave electronic device (1) according to claim 1, characterized in that each conductive member (8a) has two metal blades (11, 11') disposed in the same blade plane (P1).

3. A microwave electronic device (1) according to claim 2, characterized in that the respective blade planes (P1, P2) of two adjacent needles (8a, 8b) are substantially perpendicular.

4. A microwave electronic device (1) according to claim 1, characterized in that said grounding members (8, 8a, 8b) are disposed so that the distance between the centers of two adjacent members (8a, 8b) is less than the associated half-wavelength at said maximum frequency.

5. A microwave electronic device (1) according to claim 1, characterized in that the top grounding layer (42) is formed of a plurality of substantially square metal members (5, 5a) each having one of said perforations (7a, 7a) at its center and receiving an associated grounding member (8, 8a, 8b).

6. A microwave electronic device (1) according to claim 1, characterized in that each grounding member (8, 8a, 8b) has a portion in the form of a metal needle (8a) perpendicular to said faces (31, 32) and having a cylindrical top part (82) and a frustoconical bottom part (83) extended by said associated perforation (7a) and in contact with said top grounding layer (42).

7. A microwave electronic device (1) according to claim 6, characterized in that each of said needles (8, 8a, 8b) is centered on a respective square member (5, 5a) and said top part (82) has a diameter between the diameter of the associated perforation (7a) and the side length of the associated square (5a).

8. A microwave electronic device (1) according to, claim 1 characterized in that the lid (23) has cavities (10) in its bottom face (230) each of which is coupled to a grounding member (8a) via a metal spring (9) disposed transversely to said bottom face of the lid.

9. An opto-electronic module incorporating a microwave electronic device according to claim 1.

* * * * *